US011777457B2

United States Patent
Langer et al.

(10) Patent No.: US 11,777,457 B2
(45) Date of Patent: Oct. 3, 2023

(54) CIRCUIT AND A METHOD FOR GENERATING A RADIO FREQUENCY SIGNAL

(71) Applicant: APPLE INC., Cupertino, CA (US)

(72) Inventors: Andreas Langer, Unterschleissheim (DE); Christoph Hepp, Neubiberg (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/559,879

(22) Filed: Dec. 22, 2021

(65) Prior Publication Data

US 2022/0115996 A1 Apr. 14, 2022

Related U.S. Application Data

(63) Continuation of application No. 15/811,860, filed as application No. PCT/IB2016/053355 on Jun. 8, 2016, now Pat. No. 11,218,121.

(30) Foreign Application Priority Data

Jun. 25, 2015 (DE) .......................... 102015110238.2

(51) Int. Cl.
*H03F 1/30* (2006.01)
*H03F 3/19* (2006.01)
(Continued)

(52) U.S. Cl.
CPC ............. *H03F 3/19* (2013.01); *H03F 1/0216* (2013.01); *H03F 1/0222* (2013.01); *H03F 3/245* (2013.01);
(Continued)

(58) Field of Classification Search
CPC .................................... H03F 1/30; H03G 3/20
(Continued)

(56) References Cited

U.S. PATENT DOCUMENTS 6,141,541 A 10/2000 Midya et al.
6,725,021 B1 4/2004 Anderson et al.
(Continued)

FOREIGN PATENT DOCUMENTS

CN 101640516 A 2/2010
CN 103929135 A 7/2014
(Continued)

OTHER PUBLICATIONS

Notice of Allowance; Chinese Application No. 201680030376.4; dated Sep. 24, 2021; 5 pgs.
(Continued)

*Primary Examiner* — Henry Choe
(74) *Attorney, Agent, or Firm* — Kowert, Hood, Munyon, Rankin & Goetzel, P.C.

(57) ABSTRACT

A circuit for generating a radio frequency signal is provided. The circuit includes an amplifier configured to generate a radio frequency signal based on a baseband signal. Further, the circuit includes a power supply configured to generate a variable supply voltage based on a control signal indicating a desired supply voltage, and to supply the variable supply voltage to the amplifier. The circuit further includes an envelope tracking circuit configured to generate the control signal based on a bandwidth of the baseband signal, and to supply the control signal to the power supply.

20 Claims, 5 Drawing Sheets

(51) Int. Cl.
*H03F 3/24* (2006.01)
*H03F 1/02* (2006.01)
*H03G 3/30* (2006.01)
*H04B 1/04* (2006.01)

(52) U.S. Cl.
CPC ..... *H03G 3/3042* (2013.01); *H03F 2200/105* (2013.01); *H03F 2200/336* (2013.01); *H03F 2200/36* (2013.01); *H03F 2200/451* (2013.01); *H03G 2201/302* (2013.01); *H03G 2201/307* (2013.01); *H04B 1/04* (2013.01)

(58) Field of Classification Search
USPC .......................................... 330/297, 129, 136
See application file for complete search history.

(56) References Cited

U.S. PATENT DOCUMENTS

| | | | |
|---|---|---|---|
| 6,735,419 B2 | 5/2004 | Mitzlaff | |
| 6,888,403 B2 | 5/2005 | Cho et al. | |
| 8,428,546 B2 | 4/2013 | Lipka | |
| 8,462,883 B2 | 6/2013 | Mochizuki | |
| 8,824,981 B2 | 9/2014 | Langer et al. | |
| 8,841,967 B2 | 9/2014 | Drogi | |
| 8,854,128 B2 | 10/2014 | Onishi | |
| 8,884,697 B2 | 11/2014 | Hongo | |
| 9,065,509 B1 | 6/2015 | Yan et al. | |
| 9,276,784 B2 | 3/2016 | Folkmann et al. | |
| 9,407,476 B2 * | 8/2016 | Lim | H03F 3/24 |
| 9,450,622 B2 | 9/2016 | Menkhoff et al. | |
| 9,692,366 B2 | 6/2017 | Pilgram | |
| 2005/0225388 A1 | 10/2005 | Ramachandran et al. | |
| 2009/0088093 A1 | 4/2009 | Nentwig | |
| 2011/0280338 A1 | 11/2011 | Mochizuki | |
| 2013/0181774 A1 | 7/2013 | Khlat et al. | |
| 2013/0194979 A1 | 8/2013 | Levesque | |
| 2014/0132354 A1 | 5/2014 | Briffa et al. | |
| 2014/0213196 A1 | 7/2014 | Langer et al. | |
| 2014/0213204 A1 | 7/2014 | Balteanu et al. | |
| 2014/0241462 A1 | 8/2014 | Bellaouar et al. | |
| 2014/0266423 A1 | 9/2014 | Drogi et al. | |
| 2014/0266428 A1 | 9/2014 | Chiron et al. | |
| 2015/0098523 A1 | 4/2015 | Lim et al. | |
| 2015/0139359 A1 | 5/2015 | Folkmann et al. | |
| 2016/0182100 A1 * | 6/2016 | Menkhoff | H04W 72/541 |
| | | | 375/297 |
| 2020/0412391 A1 * | 12/2020 | Belitzer | H04B 1/62 |

FOREIGN PATENT DOCUMENTS

| | | |
|---|---|---|
| CN | 104300915 A | 1/2015 |
| JP | 2010258896 A | 11/2010 |
| KR | 20150005347 A | 1/2015 |
| WO | 2009118257 A1 | 10/2009 |
| WO | 2014078103 A1 | 5/2014 |

OTHER PUBLICATIONS

Office Action in Chinese Application No_ 201680030376.4 dated Nov. 25, 2020, with Search Report (translation included), 11 pgs.

* cited by examiner

CIRCUIT AND A METHOD FOR GENERATING A RADIO FREQUENCY SIGNAL

PRIORITY

This application is a continuation of U.S. patent application Ser. No. 15/811,860, titled "A Circuit and a Method for Generating a Radio Frequency Signal", filed on Nov. 14, 2017, which is a U.S. National Stage filing of International Application No. PCT/IB2016/053355, filed Jun. 8, 2016, titled "A Circuit and a Method for Generating a Radio Frequency Signal", which claims benefit of priority to German Application No. 102015110238.2, filed Jun. 25, 2015, all of which are hereby incorporated by reference as though fully and completely set forth herein.

The claims in the instant application are intended to be different than those of the parent application or other related applications. The Applicant therefore rescinds any disclaimer of claim scope made in the parent application or any predecessor application in relation to the instant application. Any such previous disclaimer and the cited references that it was made to avoid, may need to be revisited. Further, any disclaimer made in the instant application should not be read into or against the parent application or other related applications.

FIELD

Examples relate to envelope tracking controlled operation of amplifiers. In particular, some examples relate to a circuit and a method for generating a radio frequency signal. Some examples relate to control circuit and a method for controlling a power supply providing a variable supply voltage to an amplifier.

BACKGROUND

In a transmitter using envelope tracking, a supply voltage for an amplifier (e.g. a power amplifier) of the transmitter is adjusted depending on an instantaneous power of an input signal for the transmitter. Envelope tracking allows to efficiently operate the amplifier since the supply voltage is adjusted based on the instantaneous power demand of the amplifier. Hence, the amplifier may be deliberately operated in saturation.

A relation between the supply voltage for the amplifier and the power of the input signal is commonly determined by a specific function (e.g. called shaping function). In particular, the function may be chosen such that a gain of the amplifier follows a specific trajectory over a wide input power level. For example, the function may be chosen such that the gain of the amplifier is constant over a wide input power level. This is known as iso-gain operation of the amplifier.

However, power supplies (e.g. a DC-to-DC converter) used for providing the supply voltage to the amplifier based on the instantaneous power of the input power signal show a dependency on signal characteristics of the input signal. For example, a gain of a DC-to-DC converter (e.g. a ratio of an output voltage to an input voltage of the DC-to-DC converter) decreases with an increasing bandwidth of the input signal for the transmitter. Accordingly, a supply voltage lower than a desired supply voltage is provided to the amplifier, so that the gain of the amplifier deviates from a desired gain according to the selected trajectory. For example, for an amplifier operated in iso-gain mode, the supply voltage may be too low, so that the amplifier provides a gain that is lower than a desired gain. Deviations from the desired gain trajectory for the amplifier may, e.g., increase an Adjacent Channel Leakage Rate (ACLR) of the transmitter. Hence, there may be a desire for an improved envelope tracking controlled operation of an amplifier.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
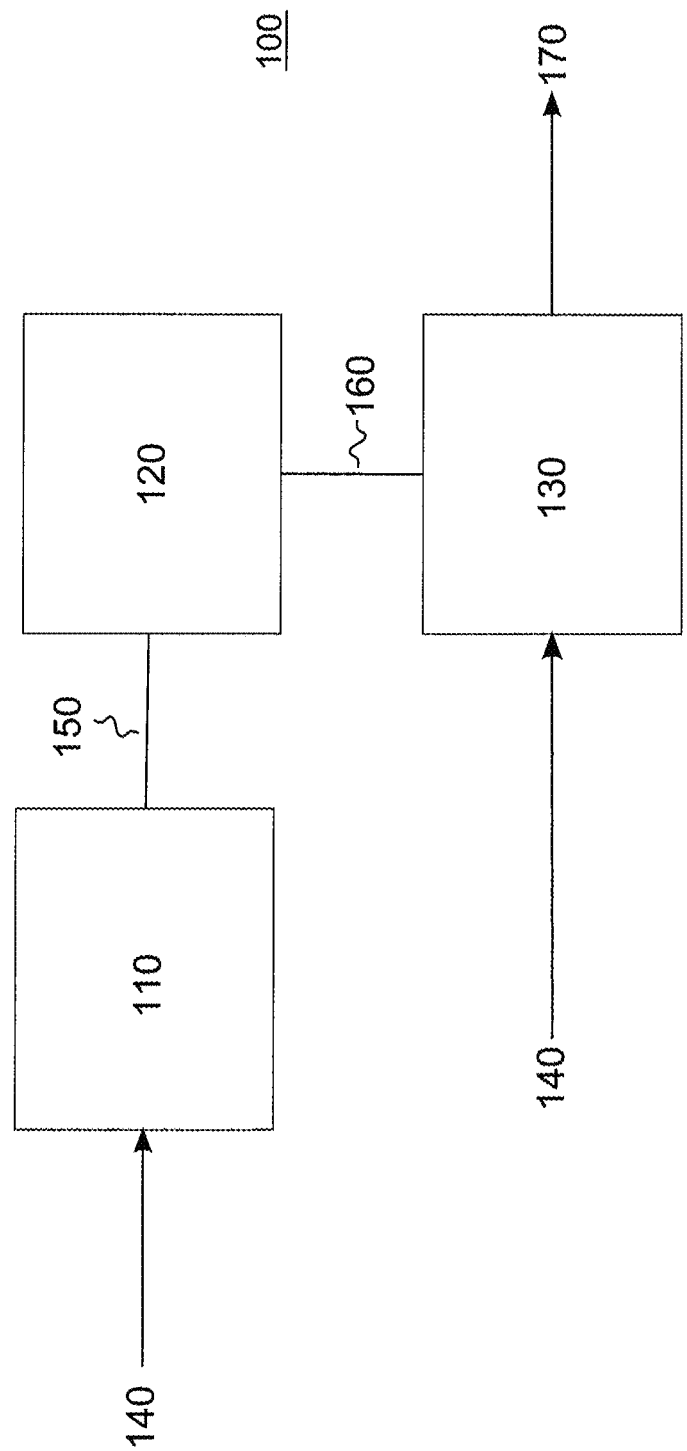
FIG. 1 illustrates an example of a circuit for generating a radio frequency signal.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art, unless expressly defined otherwise herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 schematically illustrates an example of a circuit 100 for generating a radio frequency (RF) signal 170.

The circuit 100 comprises an amplifier 130 to generate (provide) the radio frequency signal 170. The radio frequency signal 170 is based on a baseband signal 140. In some examples, the amplifier 130 may receive the baseband signal 140 and generate the radio frequency signal 170. Alternatively, the amplifier 130 may receive an intermediate radio frequency signal, which is based on the baseband signal 140, and generate the radio frequency signal 170 based on the intermediate radio frequency signal. For example, the radio frequency signal 170 may be provided to antenna element (not illustrated) for radiation to the environment.

The circuit 100 further comprises a power supply 120 configured to generate a variable supply voltage 160 based on a control signal 150. The power supply 120 is further configured to supply the variable supply voltage 160 to the amplifier 130. The control signal 150 indicates a desired supply voltage for the amplifier 130. The power supply 120 allows to provide the supply voltage 160 such that the amplifier 130 may be operated in various modes. For example, the amplifier 130 may be operated in a compression mode over a wide range of power levels of the input baseband signal 140. Accordingly, the amplifier may be operated with high efficiency.

In some examples, the power supply 120 may be implemented as a DC-to-DC converter and the control signal 150 may be an input voltage for the DC-to-DC converter. A height of the input voltage may indicate the desired supply voltage for the amplifier 130. In some examples, the power supply 120 may be implemented by a digitally controller power supply, wherein an output power of the digitally controlled power supply is based on the control signal 150.

The control signal 150 may thus be a digital signal indicating a desired output voltage of the digitally controlled power supply.

The circuit 100 comprises an envelope tracking circuit 110 to generate the control signal 150 and to supply it to the power supply 120. According to the examples described herein, the envelope tracking circuit 110 generates the control signal 150 based on a bandwidth of the baseband signal 140. For example, the bandwidth of the baseband signal 140 may be calculated (determined) by a number of allocated resource blocks for a baseband signal in a LTE system, a spectrum characteristic of the baseband signal 140, a contiguity of the spectrum characteristic, a number of spectral clusters of the baseband signal 140, or a distance between non-contiguous spectral clusters of the baseband signal 140. The control signal may, in some examples, depend on further characteristics of the baseband signal 140 (e.g. a power of the baseband signal 140).

Generating the control signal 150 based on the bandwidth of the baseband signal 140 may allow to compensate for bandwidth related variations of the supply voltage 160 provided by the power supply 120. For example, the output voltage of the power supply 120 may vary due to its non-zero output impedance. Accordingly, the output voltage of the power supply 120 may depend on the impedance of an external load connected to the power supply 120. In the example illustrated in FIG. 1, an impedance of the power supply 120 (e.g. implemented as DC-to-DC converter) may be non-zero, so that the supply voltage 160 may depend on the impedance presented to the power supply 120 by the amplifier 130. The impedance presented to the output of the power supply 120 may depend on the bandwidth of the baseband signal 140, in turn causing a dependency of the supply voltage 160 on the bandwidth of the baseband signal 140.

For example, if the power supply 120 is implemented by a DC-to-DC converter, a gain of the DC-to-DC converter may depend on the bandwidth of the baseband signal 140. For example, an output voltage of the DC-to-DC converter may be lower for a higher bandwidth compared to a lower bandwidth, if the same input voltage is provided to the DC-to-DC converter. In order to compensate for the bandwidth dependent gain of the DC-to-DC converter, the envelope tracking circuit 110 may provide an input voltage (as the control signal 150) to the DC-to-DC converter which is selected based on the bandwidth of the baseband signal 140. In some examples, the envelope tracking circuit 110 may comprise a one-dimensional look-up table storing a compensation factor for a given bandwidth of the baseband signal 140. In some examples, the envelope tracking circuit 100 may comprise a two-dimensional look-up table storing a compensation factor and a desired supply voltage for a given bandwidth of the baseband signal 140.

By compensating bandwidth related variations of the supply voltage 160 for the amplifier 130, the circuit 100 may allow to operate the amplifier 130 at a desired gain trajectory independent of the bandwidth of the baseband signal 140. For example, the circuit 100 may allow to operate the amplifier 130 in iso-gain mode independent of the bandwidth of the baseband signal 140. Accordingly, a constant signal gain of the amplifier 130 over a wide range of power levels of the baseband signal 140 (and accordingly the radio frequency signal 170) may be achieved.

For example, the envelope tracking circuit 110 may generate a first control signal for a first bandwidth of the baseband signal 140 and supply the first control signal to the power supply 120. The envelope tracking circuit may further generate a second control signal for a higher second bandwidth of the baseband signal 140 and supply the second control signal to the power supply 120. The second control signal may indicate a higher desired supply voltage than the first control signal although the desired output power of the amplifier 130 is identical. Accordingly, a decrease of output power of the power supply 120 for a higher bandwidth of the baseband signal 140 may be compensated by the second control signal. For example, if the power supply 120 is implemented as a DC-to-DC converter, an output voltage of the DC-to-DC converter may be lower for a higher (second) bandwidth compared to a lower (first) bandwidth, if a same input voltage (as control signal) is provided to the DC-to-DC converter. Accordingly, providing a higher input voltage to the DC-to-DC converter for the second bandwidth may compensate for the lower gain of the DC-to-DC converter at the second bandwidth. Hence, a constant output voltage of the DC-to-DC converter may be provided for the two different bandwidths. Accordingly, the amplifier 130 may be provided with a sufficient supply voltage 160, so that the amplifier 130 may be operated according to a desired trajectory for the amplifier gain. For example, an iso-gain operation of the amplifier independent of the bandwidth of the baseband signal 140 may be achieved, so that an ACLR of a transmitter using the circuit 100 may be reduced compared to conventional approaches. The control signal 150 may, in some examples, depend on further characteristics of the baseband signal 140 (e.g. a power of the baseband signal 140).

The circuit 100 may comprise one or more additional optional features corresponding to one or more aspects of the proposed concept or one or more examples described below.

Generally speaking, some examples relate to a means for providing a radio frequency signal. The means for generating a radio frequency signal comprises a means for generating a radio frequency signal based on a baseband signal. Further, the means comprises a means for generating a variable supply voltage based on a control signal indicating a desired supply voltage and supplying the variable supply voltage to the means for generating a radio frequency signal. The means further comprises a means for generating the control signal based on a bandwidth of the baseband signal and supplying the control signal to the means for generating a variable supply voltage. The means for providing a radio frequency signal may be implemented by a circuit for generating a radio frequency signal described above or below (e.g. FIG. 1). The means for generating a radio frequency signal may be implemented by an amplifier described above or below (e.g. FIG. 1). The means for generating a variable supply voltage may be implemented by a power supply described above or below (e.g. FIG. 1). The means for generating the control signal may be implemented by an envelope tracking circuit described above or below (e.g. FIG. 1).

Figure 2:
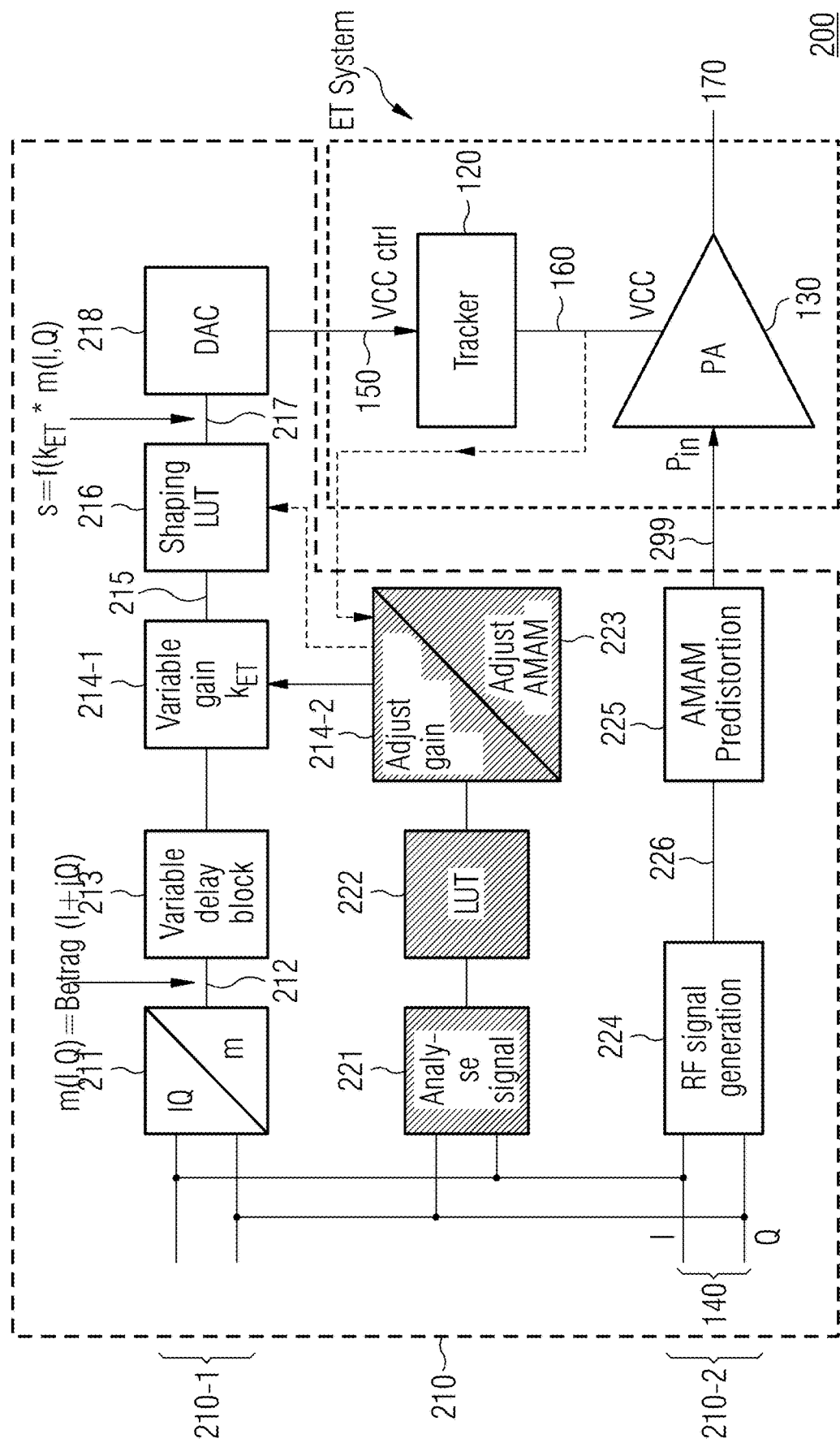
FIG. 2 illustrates another example of a circuit for generating a radio frequency signal.

FIG. 2 illustrates another example of a circuit 200 for generating a radio frequency signal 170.

The circuit 200 comprises an amplifier 130 (e.g. a power amplifier, PA) for generating the radio frequency signal 170. The amplifier 130 is provided with an input signal 299 based on a baseband signal 140 to provide the radio frequency signal 170. Further, the amplifier is provided with a supply voltage 160 ($V_{cc}$) by a power supply 120. The power supply 120 provides the supply voltage 160 based on a control signal 150 ($V_{cc\_ctr1}$). For example, the power supply 120 may be a DC-to-DC-converter. The control signal 150 is provided by an envelope tracking circuit 210.

In the example illustrated in FIG. 2, the baseband signal 140 is represented in a Cartesian representation. The baseband signal 140 comprises an in-phase component I and a quadrature component Q. Alternatively, the baseband signal 140 may be represented in a polar representation having a radius component r and a phase component φ, or any other suitable representation.

The envelope tracking circuit 210 comprises a first processing unit 211. The first processing unit 211 provides a signal 212 related to the baseband signal 140. The first processing unit 211 determines a magnitude (envelope) of the baseband signal 140. For example, the magnitude of the baseband signal 140 may be determined by evaluating m= $\sqrt{I^2+Q^2}$. For example, the first processing unit 211 may execute a CORDIC algorithm (COordinate Rotation DIgital Computer) in order to determine the magnitude of the baseband signal 140. Accordingly, the signal 212 related to the baseband signal 140 may comprise information on the magnitude of the baseband signal 140.

The signal 212 is provided to a delay element 213 in order to delay the signal 212. The delay element may compensate for different runtimes of the baseband signal 140 in envelope path 210-1 and signal provision path 210-2. A delay time of the delay element 213 may be adjustable.

The delayed signal is provided to a first part of a gain unit 214-1. The first part of the gain unit 214-1 generates an amplified signal 215 by modifying an amplitude of the signal 212 related to the baseband signal 140 by a variable gain factor $k_{ET}$. The gain factor $k_{ET}$ may compensate a gain imbalance between the envelope path 210-1 and the signal provision path 210-2. For example, a gain imbalance may occur due to an antenna mismatch (e.g. an impedance of an antenna connected to the amplifier 130 changes during operation or differs from an expected impedance value, e.g., 50 Ohm). An antenna mismatch results in reduced radiated power at a given electrical output power of the amplifier 130, which may be compensated by the variable gain factor $k_{ET}$.

The envelope tracking circuit 210 of FIG. 2 comprises a shaping unit 216. The shaping unit 216 receives the amplified signal 215 and modifies an amplitude of the amplified signal 215. A transfer function of the shaping unit 216 (e.g. a relation between an input signal and an output signal of the shaping unit 216) may be selected according to a desired gain trajectory of the amplifier 130. For example, the transfer function of the shaping unit 216 may be selected such that the amplifier 130 is operated in iso-gain mode. The shaping unit 216 provides a shaped signal 217 indicating a desired supply voltage of the power supply 120.

A Digital-to-Analog converter (DAC) 218 receives the shaped signal 217 and generates an analog control signal 150 based on the shaped signal 217. In some examples, the envelope tracking circuit may not comprise the shaping unit 216, so that the amplified signal 215 is provided to the DAC 218. Accordingly, the DAC may generate the control signal 150 for the power supply 120 based on the amplified signal 115.

The envelope tracking circuit 210 further comprises a signal analysis unit 221 configured to determine the bandwidth of the baseband signal 140. For example, if the radio frequency signal 170 is a radio frequency signal for LTE communications comprising a number of allocated resource blocks, the signal analysis unit 221 may determine the bandwidth of the baseband signal 140 based on the number of allocated resource blocks. A resource block may be an aggregation of twelve 15 kHz wide resource elements (sub-carrier) during a timeslot of 0.5 ms in LTE communications. For example, the signal analysis unit 221 may determine the number of adjoined allocated resource blocks. Using the number of allocated resource blocks may be an energy and time efficient implementation for determining the bandwidth of a baseband signal in LTE communications. In some examples, the signal analysis unit may determine a width and/or a center frequency of a frequency range containing non-adjoined allocated resource blocks. In other examples, the signal analysis unit 221 may determine the bandwidth of the baseband signal 140 based on, e.g., a spectrum characteristic of the baseband signal 140, a contiguity of the spectrum characteristic, a number of spectral clusters of the baseband signal 140, or a distance between non-contiguous spectral clusters of the baseband signal 140.

A second part of the gain unit 214-2 uses the determined bandwidth of the baseband signal 140 for adjusting the gain factor $k_{ET}$. For example, a look-up table (LUT) 222 may be provided. The look-up table 222 may provide gain correction values for the gain factor $k_{ET}$ depending on the bandwidth of the baseband signal 140. The gain correction values may, e.g., be provided by a manufacturer of the circuit 200. For example, the gain correction values may be determined by factory or lab calibration. Alternatively, a second processing unit may be provided instead of the look-up table 222 in order to calculate the gain correction values based on the determined bandwidth of the baseband signal 140. Hence, (the first and the second part of) the gain unit may adjust the gain factor $k_{ET}$ based on the signal bandwidth of the input signal 140, using an already existing first part of the gain unit 214-1 for compensating effects caused by the variable bandwidth.

Alternatively or additionally, the second part of the gain unit 214-2 may further modify the transfer function of the (optional) shaping unit 216. For example, the gain unit 214-2 may modify, add, remove or replace coefficients of the transfer function of the shaping unit 216.

Adjusting the gain factor $k_{ET}$ may allow to adjust the control signal 150 provided by the DAC 218 based on the bandwidth of the baseband signal 140. The adjusted control signal 150 may be used to compensate for bandwidth related variations of the supply voltage 160 provided by the power supply 120. For example, if the power supply 120 is implemented as a DC-to-DC converter, a gain of the DC-to-DC converter may be lower for a higher (second) bandwidth of the baseband signal 140 compared to a lower (first) bandwidth of the baseband signal 140. Accordingly, the supply voltage 160 for the amplifier 130 may be lower for the higher bandwidth compared to the lower bandwidth, if the control signal 150 was the same for the higher bandwidth and the lower bandwidth of the baseband signal 140. For example, by providing a higher supply voltage to the DC-to-DC converter (i.e. a control signal 150 that indicates a higher desired supply voltage) for the higher bandwidth, the lower gain of the DC-to-DC converter may be compensated. Accordingly, a constant supply voltage 160 may be supplied to the amplifier 130—independent of the bandwidth of the baseband signal 140.

For example, the second part of the gain unit 214-2 may increase the gain factor $k_{ET}$ for a higher bandwidth of the baseband signal. For example, the look-up table 222 may provide a specific gain correction value or factor for the determined bandwidth of the baseband signal 140 to the second part of the gain unit 214-2. The second part of the gain unit 214-2 may modify (e.g. add or multiply) a standard gain factor $k_{ET}'$, which may compensate a gain imbalance between the envelope path 210-1 and the signal provision path 210-2 without considering any bandwidth related effects, by the gain correction value in order to provide the gain factor $k_{ET}$, which takes into account bandwidth related effects. For example, the second part of the gain unit 214-2 may add or subtract the gain compensation value to/from the standard gain factor $k_{ET}'$, or the second part of the gain unit 214-2 may scale the standard gain factor $k_{ET}'$ by the gain compensation value.

By modifying the gain factor $k_{ET}$ based on the bandwidth of the baseband signal 140, a total gain of the envelope path 210-1 and the power supply 120 may be kept constant, since a gain variation of the power supply 120 (e.g. a DC-to-DC converter) may be compensated by an according gain variation of the envelope path 210-1. Accordingly, the supply voltage 160 provided to the amplifier 130 may be kept constant, so that the amplifier 130 may operate on a desired gain trajectory (e.g. iso-gain). Accordingly, an ACLR of a transmitter using the circuit 200 may be reduced compared to conventional solutions.

The impact of a variation of the supply voltage 160 for different bandwidths of the baseband signal 140 may further depend on device characteristics of the amplifier 130. Hence, the envelope tracking circuit 210 may further generate the control signal 150 based on at least one device characteristic of the amplifier 130.

For example, a gain dispersion characteristic of the amplifier 130 may influence the impact of the supply voltage variation. The gain dispersion may describe how a gain of the amplifier 130 depends on the supply voltage 160 for a low power of the output signal 170 (e.g. 0 Decibel-milliwatt (dBm)). The higher the gain dispersion of the amplifier 130, the higher a gain change of the amplifier 130 for a change of the supply voltage 160 may be. Accordingly, an amplifier having a higher gain dispersion may be more sensitive to changes of its supply voltage. For example, for iso-gain operation of the amplifier, a higher gain dispersion may cause a higher deviation from a desired constant gain trajectory of the amplifier for an incorrect supply voltage. For iso-gain operation, a desired gain trajectory (e.g. indicating an average gain) may be a straight line at a substantially constant gain value for a given range of the amplifier's output power, i.e., a straight having substantially no slope. For an incorrect supply voltage, the straight line may have a slope for the given range of the amplifier's output power, i.e., it may deviate from the desired constant gain trajectory. A value of the straight line's slope may be an indicator for the imperfection of the supply voltage for the amplifier, i.e., an indicator for the gain variation within the given range of the amplifier's output power. An increased slope may indicate a higher level of imperfection of the supply voltage, i.e., an increased gain variation within the given range of the amplifier's output power.

For example, a load-line characteristic of the amplifier 130 may influence the impact of the supply voltage variation. The load-line of an amplifier may describe the required supply voltage for achieving a desired output power of the amplifier. For example, an amplifier having a high load-line may require a higher supply voltage for achieving a desired output power compare to an amplifier having a lower load-line. An amplifier with a higher load-line may cause a smaller change of the gain of the power supply for different bandwidths of the baseband signal. For example, for iso-gain operation of the amplifier, a higher load-line may cause a smaller deviation (slope) from a desired constant gain trajectory of the amplifier for an incorrect supply voltage.

Accordingly, the envelope tracking circuit 210 may further generate the control signal 150 based on at least one of a gain dispersion of the amplifier 130 and a load-line of the amplifier 130. For example, the look-up table 222 may contain gain correction values which are adapted to the specific gain dispersion of the amplifier 130 and/or the load-line of the amplifier 130. For example, the look-up table 222 may store increased gain correction values for an amplifier 130 having a higher gain dispersion compared to gain correction values for an amplifier 130 having a lower gain dispersion. For example, the look-up table 222 may store increased gain correction values for an amplifier 130 having a lower load-line compared to gain correction values for an amplifier 130 having a higher load-line. The look-up table 222 may further store gain correction values taking into account both device characteristics. Additionally, the gain correction values may be adapted to further device characteristics of the amplifier 130 influencing its gain characteristics.

The characteristics of the amplifier 130 may further depend on a frequency of the radio frequency signal 170. Hence, the envelope tracking circuit 210 may further generate the control signal 150 based on a frequency of the radio frequency signal 170. For example, the look-up table 222 may store a specific set of gain correction values for a specific frequency of the radio frequency signal 170. For example, the look-up table 222 may store a specific set of gain correction values for each sub-band of a transmit band used within mobile communications. For example, the look-up table 222 may store a specific set of gain correction values for each channel of a transmission band. Accordingly, the different sets of gain correction values may enable a constant gain trajectory of the amplifier for different frequencies of the radio frequency signal 170.

For example, for the radio frequency signal 170 being a radio frequency signal for LTE communications comprising a plurality of allocated resource blocks at different frequencies of the radio frequency signal 170, the envelope tracking circuit 210 may generate the control signal 150 based on a frequency related to the different frequencies of the plurality of allocated resource blocks. For example, the frequency related to the different frequencies of the plurality of allocated resource blocks may be a center frequency of the different frequencies of the plurality of allocated resource blocks. The second part of the gain unit 214-2 may select a gain correction value for a frequency which is closest to the determined center frequency (further taking into account the bandwidth of the baseband signal 140), for example. In some examples, the second part of the gain unit 214-2 may determine a gain correction value for the center frequency by combining a gain correction value for a lower frequency (being stored in the look-up table 222) being closest to the determined center frequency and a gain correction value a higher frequency (being stored in the look-up table 222) being closest to the determined center frequency. For example, the second part of the gain unit 214-2 may perform an interpolation taking into account a distance between the determined center frequency and the closest higher or lower frequencies stored in the look-up table 222.

By additionally generating the control signal 150 depending on the frequency of the radio frequency signal 170, frequency related characteristics of the amplifier 130 may be taken into account. Accordingly, an efficiency of the amplifier 130 may be increased.

The envelope tracking circuit 210 may further provide the control signal 150 based on an average value of the supply voltage 160 during a predefined time interval. For example, the predefined time interval may on average be at least one subframe (1 millisecond) long for LTE communications. In some examples, the predefined time interval may on average be plural subframes (e.g. 2, 3, 4, 5 or 10 subframes) long in order to reduce measurement uncertainties or other impairments. The average value of the supply voltage 160 may indicate an impedance of a load (e.g. the amplifier 130) connected to the output of the power supply 120. As discussed above, a higher impedance may cause a higher supply voltage 160 (e.g. a higher gain of a DC-to-DC converter used as power supply). Accordingly, the control signal 150 for the power supply may be adjusted to provide a constant supply voltage 160.

In some examples, the envelope tracking circuit 210 may generate a control signal 150 indicating a lower desired supply voltage than the instantaneous control signal 150, if the average value of the supply voltage 160 is higher than a reference value for the supply voltage 160. The reference value for the supply voltage may be different for different output power levels of the amplifier 130. For example, a reference value for the supply voltage 160 may be determined for different output power levels assuming that an antenna having an impedance of 50 Ohm is connected to the output of the amplifier 130, respectively.

By comparing the average value of the supply voltage 160 to the reference value, the envelope tracking circuit 210 may determine that an output impedance of the power supply is increased, so that an increased supply voltage 160 is provided to the amplifier 130. Accordingly, the envelope tracking circuit 210 may provide a control signal 150 to the power supply 120 indicating a lower desired supply voltage for the amplifier 130. Accordingly, the supply voltage 160 may lowered. For example, the average value of the supply voltage 160 may be provided to the second part of the gain unit 214-2 or the second part of the gain unit 214-2 may determine the average value of the supply voltage 160. The look-up table 222 may store the reference value for the specific output power of the amplifier 130. The second part of the gain unit 214-2 may compare the determined average value to the reference value for the supply voltage 160. Based on the comparison, the second part of the gain unit 214-2 may adjust the gain factor $k_{ET}$. For example, the look-up table 222 may store gain correction values for the specific output power level of the amplifier 130 in order to enable the second part of the gain unit 214-2 to properly provide the gain factor $k_{ET}$.

The bandwidth dependent provision of the supply voltage 160 by the power supply 120 may further be compensated by providing a modified input signal 299 to the amplifier 130.

In some examples, the input signal 299 for the amplifier may be the baseband signal 140. For example, the input signal 299 may be an amplitude modulated (AM) signal. In some examples, the envelope tracking circuit may comprise a pre-distortion circuit configured to supply, to the amplifier 130, a modified baseband signal based on a further control signal. The further control signal is based on the bandwidth of the baseband signal 140. By controlling the operation mode of the pre-distortion circuit depending on the bandwidth of the baseband signal 140, a mismatch of a desired gain of the amplifier 130 and a presently achievable gain of the amplifier 130, which depends on the supply voltage 160 presently provided by the power supply 120, can be anticipated and appropriately considered within the pre-distortion circuit, so that distortions of the radio frequency signal 170 related the gain mismatch of the amplifier 130 may be reduced or even completely suppressed. The further control signal may control an amount of the modification by the pre-distortion circuit. The modification may be used to compensate for amplification gain variations of the amplifier 130 which result from using a supply voltage different from a desired supply voltage. For example, the pre-distortion circuit may have a transfer function which is substantially inverse to a transfer function of the amplifier 130, so that an overall response of the system comprising the pre-distortion circuit and the amplifier 130 is linear.

FIG. 2 illustrates another example using pre-distortion. A radio frequency signal generator 224 generates an intermediate radio frequency signal 226 based on the baseband signal 140. The intermediate radio frequency signal 226 is provided to pre-distortion circuit 225. The pre-distortion circuit 225 provides a modified intermediate radio frequency signal as input signal 299 to the amplifier 130. The pre-distortion circuit 225 is controlled based on a further control signal. The further control signal depends on the bandwidth of the baseband signal 140. For example, a pre-distortion adjustment unit 223 may adjust a transfer characteristic of the pre-distortion circuit 225 (e.g. a concrete function describing the modification of a signal input to the pre-distortion circuit 225). For example, the pre-distortion adjustment unit 223 may adjust the transfer characteristic based on information given in the look-up table 222 for the determined bandwidth of the baseband signal 140. For example, the pre-distortion adjustment unit 223 may add, modify, remove or replace coefficients of the transfer characteristic of the pre-distortion circuit 225. For iso-gain operation of the amplifier 130, pre-distortion may allow to mitigate a deviation (slope) from a desired constant gain trajectory of the amplifier, for example. Accordingly, an ACLR of a transmitter using the circuit 200 may be reduced compared to conventional approaches.

In some examples, a supply voltage $V_{cc}$ of a power amplifier (PA) may depend on an instantaneous envelope of a (amplitude) modulated baseband (BB) signal m(I,Q). The envelope of the modulated BB signal may be calculated by means of CORDIC algorithm, followed by a delay adjustment to compensate a different delay in a main signal path (RF signal generation path) and the envelope tracking (ET) path. A variable gain block may set a gain of the ET path to compensate a gain imbalance between the ET path and the main signal path during operation (e.g. in case of antenna mismatch). The envelope signal may be shaped (e.g. to achieve a desired iso-gain operation). A digital-to-analog converter may generate an input voltage $V_{cc\_ctrl}$ for a tracker (power supply, e.g., a DC-to-DC converter). This signal may be applied to the tracker that generates a variable PA supply voltage $V_{cc}$.

A transmit bandwidth dependent tracker gain may cause an unwanted slope in an Amplitude Modulated/Amplitude Modulated (AMAM) transfer characteristic of the PA and a subsequent degradation of the ET performance (e.g. indicated by a worse ACLR). This may be caused by a frequency dependent output impedance of the tracker. The total gain of the ET path may be given by the variable gain block $k_{ET}$ and by the gain of the tracker. If the gain of the ET path changes, the instantaneous supply voltage $V_{cc}$ may match not any more to the instantaneous envelope of the RF signal. As a result, the shaping operation may not provide any more a desired gain trajectory (e.g. iso-gain trajectory). Different transmit bandwidths may result in a different tracker gain changing the total gain of the ET path and violate, e.g., a desired iso-gain trajectory of the PA gain (e.g. a (AMAM) slope instead of a constant gain trajectory may be caused). Therefore, the transmit signal may be analyzed in order to at least determine the bandwidth of the signal.

To compensate the unwanted AMAM slope, the gain in the ET path may be changed in order to recover the total gain of ET path which was set during ET calibration when the shaping function was determined. Further, AMAM pre-distortion of the RF input signal may be applied in order to account for the AMAM slope of the PA. For recovering the gain in the ET path, a gain correction may be applied depending on the transmit bandwidth. The gain correction may be stored in a look-up table (LUT). The LUT may include the gain correction depending on the transmit bandwidth.

However the AMAM slope occurring in response to a gain change of the tracker may further depend on PA characteristics. The PA characteristic may for instance be given by PA a gain dispersion and a PA load-line. The gain dispersion may describe how the PA gain depends on $V_{cc}$ at low power (e.g. 0dBm). The higher the gain dispersion is the higher the gain change at low power may be, when the PA supply voltage $V_{cc}$ changes. PAs with high gain dispersion may show more AMAM sloping compared to PAs with low dispersion for a same gain change of the tracker. The PA load-line may determines the $V_{cc}$ level required to achieve a target output power during ET operation. PAs with higher load-line may require a higher voltage compared to PAs with lower load-line. PAs with high load-line may cause less change of tracker gain vs. transmission bandwidth and subsequently less AMAM sloping may occur. As described above, the tracker gain change may be caused by the non-zero and frequency dependent output impedance of the tracker. For PAs with higher load-line, the output impedance of tracker may have less impact on the voltage ratio ("voltage divider").

As s a result of the various dependencies, the gain correction may depend on a transmit band and a transmit channel within the band. Each transmit band may be divided into sub-bands (e.g. 5-10 MHz wide) and a different gain correction may be applied for each sub-band accounting for changes of PA characteristic versus frequency. The sub-band wise correction is a usual procedure for ET. To improve performance in ET mode each transmit band may be divided into sub-bands. For each sub-band there may be a dedicated shaping function and dedicated ET delay calibration. One may use the already existing sub-bands as frequency grid for the tracker gain correction. The LUT may include a gain correction value for each sub-band. The gain correction vs. transmit bandwidth may either be a table or a function which for instance calculates the gain correction depending on number of resource blocks (RB) in a particular sub-band. Since the gain correction may be applied in a feedforward way, the correction values should be pre-determined (e.g. during factory calibration or during lab optimization).

If AMAM pre-distortion is used, the compensation may work in a similar or same way. The LUT may include AMAM coefficients for each sub-band to generate a pre-distortion characteristic.

Further, the gain correction may be applied depending on the average $V_{cc}$ which occurs during ET operation. This may improve the performance for an antenna mismatch since the antenna mismatch may change the PA load-line and thus the average $V_{cc}$ to achieve a target power. A higher average $V_{cc}$ may indicate that a load of the tracker (impedance) is higher. This may causes less voltage drop across the tracker output impedance and subsequently a higher gain. If the average voltage $V_{cc}$ increases (e.g. due to an antenna mismatch), it may be concluded that the tracker gain increases and less gain correction should be applied. For example, the LUT may contain average $V_{cc}$ vs. output power at 50 Ohm antenna condition. The LUT may be generated during factory calibration. During operation at a certain output power, the measured $V_{cc}$ at the certain output power level may be compared with the $V_{cc}$ value from the LUT for a same power, for example. If for the same power the measured voltage is higher, the gain correction value may be reduced (assuming a higher tracker gain).

More general, one or more stimuli of the ET system may be adjusted depending on one or more characteristics of the transmit signal. A first characteristic may be at least the transmission bandwidth of the transmit signal. In case of a LTE signal, the transmission bandwidth may be given by the number of allocated resource blocks. The one or more stimuli of the ET system may comprise the RF input signal applied to the PA or the input voltage envelope applied to the tracker or both in combination. The PA input signal as a first stimuli may be adjusted to compensate the AMAM slope of the PA by adding an inverse slope using pre-distortion. The applied inverse slope may at least depend on the transmission bandwidth of the transmit signal. The voltage envelope as a second stimuli may be adjusted by at least changing the gain of the transceiver-internal ET path. The gain may be changed depending on the transmission bandwidth of the transmit signal. Hence, some examples relate to the compensation of an unwanted AMAM slope in an ET system.

The circuit 200 may comprise one or more additional optional features corresponding to one or more aspects of the proposed concept or one or more examples described above or below (e.g. FIG. 1).

Figure 3:
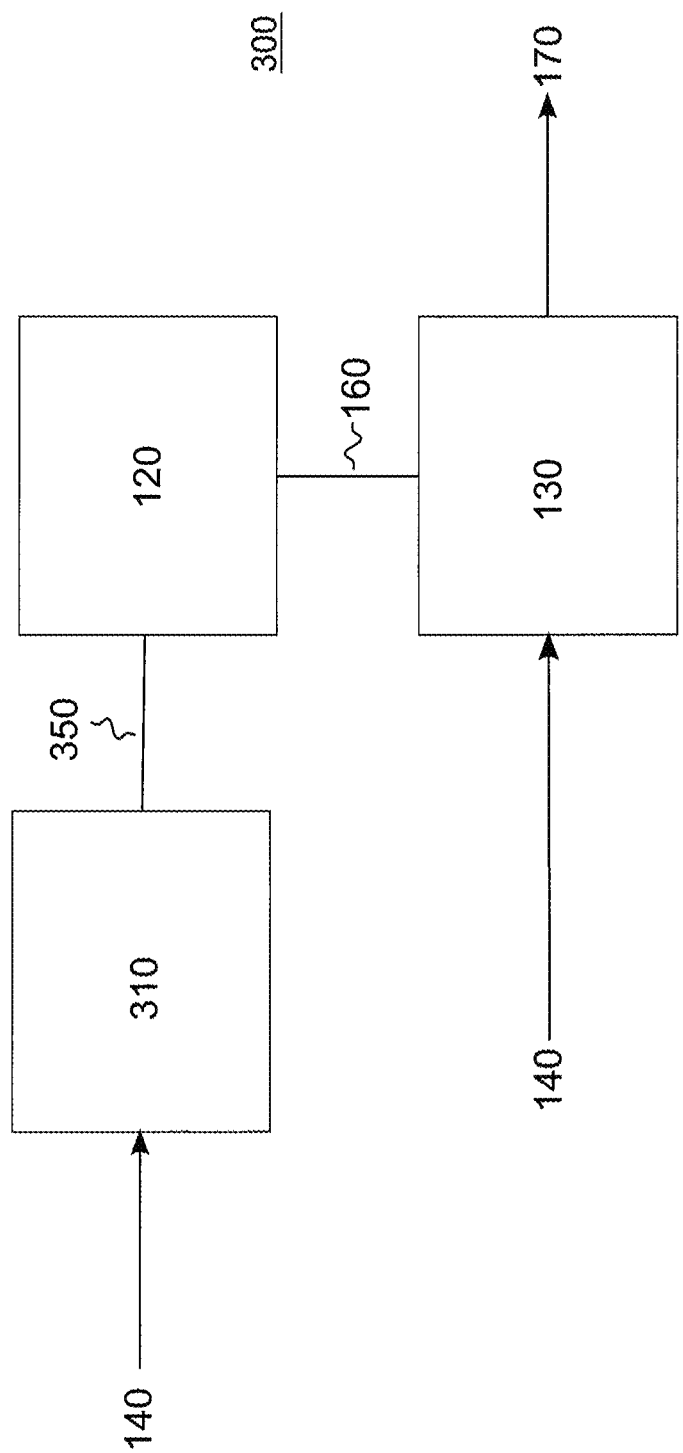
FIG. 3 illustrates an example of an amplification circuit comprising a control circuit for controlling a power supply providing a variable supply voltage to an amplifier.

FIG. 3 illustrates an example of an amplification circuit 300. The amplification circuit 300 comprises a control circuit 310 for controlling a power supply 120 supplying a variable supply voltage 160 to an amplifier 130.

The amplifier 130 generates a radio frequency signal 170 based on a baseband signal 140. The control circuit 310 mitigates a gain variation of the power supply 120 by generating a control signal 350 based on a bandwidth of the baseband signal 140 and supplying the control signal 350 to the power supply 120.

As discussed above (e.g. in connection with FIGS. 1 and 2), the output voltage of a power supply may vary due to its non-zero output impedance. Accordingly, the output voltage of the power supply may depend on the impedance of an external load connected to the power supply. In the example illustrated in FIG. 3, an impedance of the power supply 120 (e.g. implemented as DC-to-DC converter) may be non-zero, so that the supply voltage 160 may depend on the impedance presented to the power supply 120 by the amplifier 130. The impedance presented to the output of the power supply 120 may depend on the bandwidth of the baseband signal 140. Accordingly, providing the control signal 350 for the power supply 120 based on the bandwidth of the baseband signal 140 may allow to at least mitigate (or compensate) the bandwidth dependent output of the power supply 120. Hence, a constant supply voltage 160 may be provided to the amplifier 130 for different bandwidths of the baseband signal 140. Accordingly, the amplifier 130 may be operated on a desired gain trajectory. A transmitter using the amplification circuit 300 may thus achieve an improved ACLR compared to conventional approaches.

The control circuit 310 may comprise one or more additional optional features corresponding to one or more aspects of the proposed concept or one or more examples described above or below.

Generally speaking, some examples relate to a means for controlling a power supply providing a variable supply voltage to an amplifier. The amplifier provides a radio frequency signal based on a baseband signal. The means for controlling is configured to mitigate a gain variation of the power supply by providing, to the power supply, a control signal based on a bandwidth of the baseband signal. The means for controlling may be implemented by a control circuit described above or below (e.g. FIG. 3).

Figure 4:
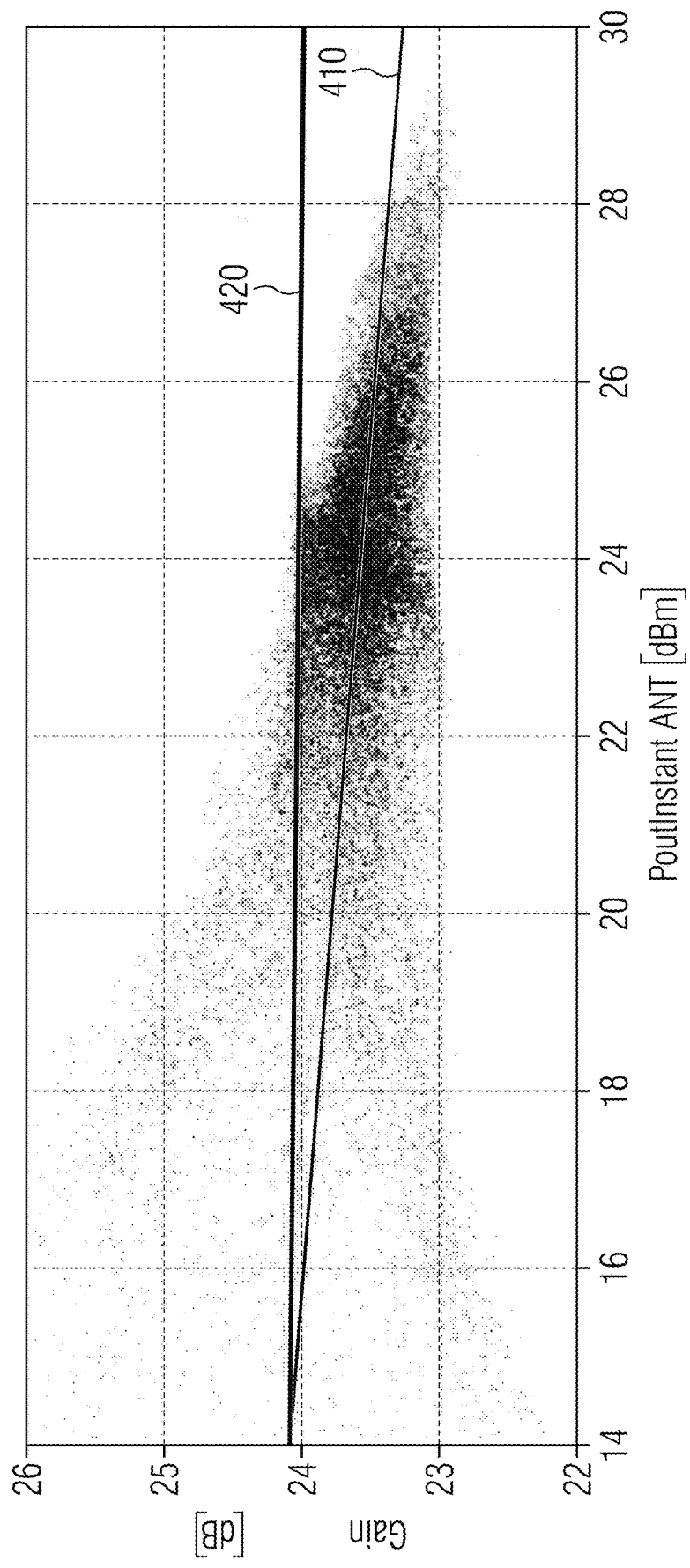
FIG. 4 illustrates an example of a relation between an average amplifier gain and an output power of the amplifier according to an example described herein and a relation between an average amplifier gain and an output power of the amplifier according to a conventional solution.

An example of a relation 410 between an average amplifier gain and an output power of the amplifier for an amplifier operation according to one or more aspects of the proposed concept or one or more examples described above is illustrated in FIG. 4. As a reference, a relation 420 between an average amplifier gain and an output power of the amplifier for an amplifier operation according to a conventional solution is illustrated. The abscissa of FIG. 4 denotes an output power of the amplifier in dBm. The ordinate denotes an amplifier gain. FIG. 4 illustrates a situation where the amplifier is operated in iso-gain mode.

It is evident that for reference relation 420 the average gain of the amplifier is not constant (the clouded distribution of the gain values may be neglected since they are related to other effects). The gain trajectory (straight line) of relation 420 shows a slope. The higher a bandwidth of a baseband signal for the amplifier, the more dominant the slope may be. On the contrary, the example of a relation 420 for an amplifier operation according to one or more aspects of the proposed concept or one or more examples described above shows a substantially constant average amplifier gain. The average gain may be independent of the bandwidth of the baseband for an amplifier operation according to one or more aspects of the proposed concept or one or more examples described above. Accordingly, an amplifier operation according to one or more aspects of the proposed concept or one or more examples described above may allow to operate an amplifier on a desired gain trajectory (e.g. iso-gain) independent of a bandwidth of the baseband signal.

Figure 5:
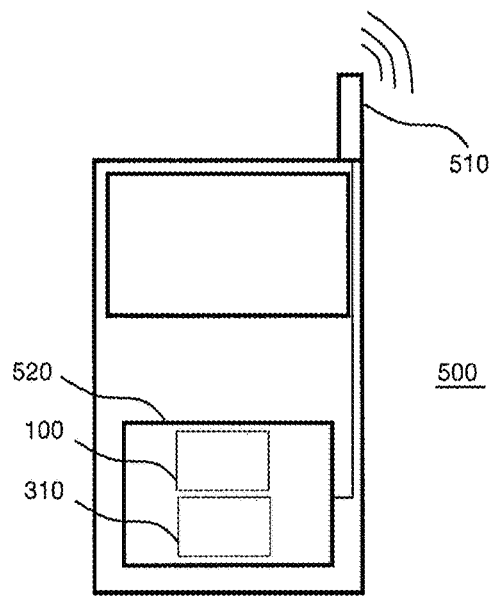
FIG. 5 illustrates an example of a mobile communications device comprising an example of a circuit for generating a radio frequency signal and/or an example of a control circuit for controlling a power supply providing a variable supply voltage to an amplifier.

FIG. 5 schematically illustrates an example of a mobile communications device or mobile phone or user equipment 800 comprising an apparatus 100 for generating a radio frequency signal depending on a baseband signal according to an example described herein and/or a control circuit 310 for controlling a power supply providing a variable supply voltage to an amplifier according to an example described herein. The apparatus 100 and/or the control circuit 310 may be comprised in a transmitter 520. An antenna element 510 of the mobile communications device 500 may be coupled to the transmitter 520 to radiate a signal into the environment and to wirelessly transmit the signal. To this end, mobile communications devices may be provided having an envelope tracking system with improved ACLR and lower current consumption.

Figure 6:
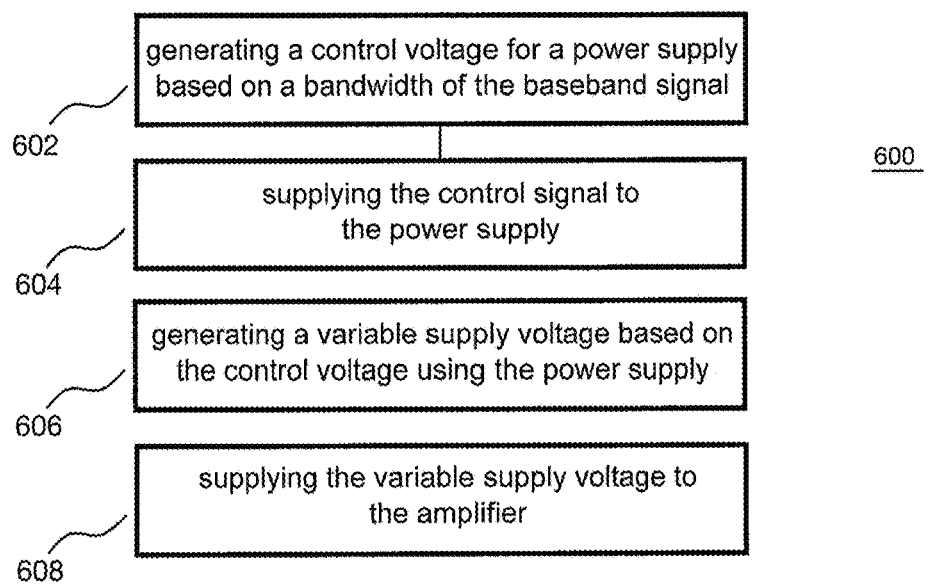
FIG. 6 illustrates a flowchart of an example of a method for generating a radio frequency signal.

An example of a method 600 for generating a radio frequency signal depending on a baseband signal using an amplifier is illustrated by means of a flowchart in FIG. 6. The method comprises generating 602 a control signal for a power supply based on a bandwidth of the baseband signal. The method further comprises supplying 604 the control signal to the power supply. Further, the method comprises generating 606 a variable supply voltage based on the control signal using the power supply. The control signal indicates a desired supply voltage. The method further comprises supplying 608 the variable supply voltage to the amplifier.

More details and aspects of the method are mentioned in connection with the proposed concept or one or more examples described above or below (e.g. FIGS. 1-5). The method may comprise one or more additional optional features corresponding to one or more aspects of the proposed concept or one or more examples described above or below.

Figure 7:
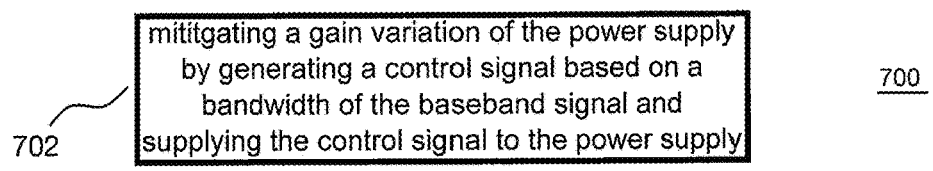
FIG. 7 illustrates a flowchart of an example of a method for controlling a power supply.

An example of a method 700 for controlling a power supply supplying a variable supply voltage to an amplifier is illustrated by means of a flowchart in FIG. 7. The amplifier generates a radio frequency signal based on a baseband signal. The method comprises mitigating 702 a gain variation of the power supply by generating a control signal based on a bandwidth of the baseband signal and supplying the control signal to the power supply.

More details and aspects of the method are mentioned in connection with the proposed concept or one or more examples described above (e.g. FIGS. 1-5). The method may comprise one or more additional optional features corresponding to one or more aspects of the proposed concept or one or more examples described above.

The examples as described herein may be summarized as follows:

Example 1 is a circuit for generating a radio frequency signal, comprising: an amplifier configured to generate the radio frequency signal based on a baseband signal; a power supply configured to generate a variable supply voltage based on a control signal indicating a desired supply voltage, and to supply the variable supply voltage to the amplifier; and an envelope tracking circuit configured to generate the control signal based on a bandwidth of the baseband signal, and to supply the control signal to the power supply.

In example 2, the envelope tracking circuit of the circuit of example 1 is further configured to generate the control signal based on a power of the baseband signal.

In example 3, the envelope tracking circuit of the circuit of example 1 or example 2 is configured to: generate a first control signal for a first bandwidth of the baseband signal, and supply the first control signal to the power supply; and generate a second control signal for a higher second bandwidth of the baseband signal, and supply the second control signal to the power supply, the second control signal indicating a higher desired supply voltage than the first control signal.

In example 4, the envelope tracking circuit of the circuit of example 1, example 2 or example 3 comprises a signal analysis unit configured to calculate the bandwidth of the baseband signal.

In example 5, the radio frequency signal is a radio frequency signal for Long Term Evolution communications comprising a number of allocated resource blocks, and the signal analysis unit of the circuit of example 4 is configured to calculate the bandwidth of the baseband signal based on the number of allocated resource blocks.

In example 6, the envelope tracking circuit of the circuit of example 4 or example 5 further comprises: a gain unit configured to generate an amplified signal by modifying an amplitude of a signal related to the baseband signal by a gain factor; and a digital-to-analog conversion unit configured to generate the control signal for the power supply based on the amplified signal, wherein the gain unit is configured to adjust the gain factor based on the signal bandwidth of the baseband signal.

In example 7, the signal related to the baseband signal in the circuit of example 6 comprises information on a magnitude of the baseband signal.

In example 8, the envelope tracking circuit of the circuit of any of the preceding examples is further configured to generate the control signal based on a frequency of the radio frequency signal.

In example 9, the radio frequency signal is a radio frequency signal for Long Term Evolution communications comprising a plurality of allocated resource blocks at different frequencies of the radio frequency signal, and the envelope tracking circuit of the circuit of example 8 is configured to generate the control signal based on a frequency related to the different frequencies of the plurality of allocated resource blocks.

In example 10, the frequency related to the different frequencies of the plurality of allocated resource blocks in the circuit of example 9 is a center frequency of the different frequencies of the plurality of allocated resource blocks.

In example 11, the envelope tracking circuit of the circuit of any of the preceding examples is further configured to generate the control signal based on an average value of the supply voltage during a predefined time interval.

In example 12, the envelope tracking circuit of the circuit of example 11 is configured to generate a control signal indicating a lower desired supply voltage than the instantaneous control signal, if the average value of the supply voltage is higher than a reference value for the supply voltage.

In example 13, the reference value for the supply voltage in the circuit of example 12 is different for different output power levels of the amplifier.

In example 14, the envelope tracking circuit of the circuit of any of the preceding examples is further configured to generate the control signal based on a device characteristic of the amplifier.

In example 15, the device characteristic of the amplifier in the circuit of example 14 comprises at least one of a gain dispersion of the amplifier and a load-line of the amplifier.

In example 16, the envelope tracking circuit of the circuit of any of the preceding examples is configured to generate a further control signal based on the bandwidth of the baseband signal, and the circuit further comprises a predistortion circuit configured to supply, to the amplifier, a modified baseband signal based on the further control signal.

Example 17 is a control circuit for controlling a power supply supplying a variable supply voltage to an amplifier, the amplifier generating a radio frequency signal based on a baseband signal, wherein the control circuit is configured to mitigate a gain variation of the power supply by generating a control signal based on a bandwidth of the baseband signal and supplying the control signal to the power supply.

Example 18 is a transmitter comprising a circuit for generating a radio frequency signal according to any of examples 1 to 16 or a control circuit for controlling an amplifier according to example 17.

Example 19 is a mobile communications device comprising a transmitter according to example 18.

In example 20, the mobile communications device of example 19 further comprises at least one antenna coupled to the transmitter.

Example 21 is a means for providing a radio frequency signal, comprising: a means for generating a radio frequency signal based on a baseband signal; means for generating a variable supply voltage based on a control signal indicating a desired supply voltage and supplying the variable supply voltage to the means for generating a radio frequency signal; and a means for generating the control signal based on a bandwidth of the baseband signal and supplying the control signal to means for generating a variable supply voltage.

In example 22, the means for providing the control signal of the means of example 21 is configured to: generate a first control signal for a first bandwidth of the baseband signal, and supply the first control signal to the means for providing a variable supply voltage; and generate a second control signal for a higher second bandwidth of the baseband signal, and supply the second control signal to the means for providing a variable supply voltage, the second control signal indicating a higher desired supply voltage than the first control signal.

Example 23 is a means for controlling a power supply supplying a variable supply voltage to an amplifier, the amplifier generating a radio frequency signal based on a baseband signal, wherein the means for controlling is configured to mitigate a gain variation of the power supply by generating a control signal based on a bandwidth of the baseband signal and supplying the control signal to the power supply.

Example 24 is a method for generating a radio frequency signal depending on a baseband signal using an amplifier, comprising: generating a control signal for a power supply based on a bandwidth of the baseband signal; supplying the control signal to the power supply; generating a variable supply voltage based on the control signal using the power supply; and supplying the variable supply voltage to the amplifier, wherein the control signal indicates a desired supply voltage.

In example 25, generating the control signal in the method of example 24 is further based on a power of the baseband signal.

In example 26 generating the control signal for the power supply and supplying the control signal to the power supply in the method of example 24 or example 25 comprises: generating a first control signal for the power supply for a first bandwidth of the baseband signal; supplying the first control signal to the power supply; providing a second control signal for the power supply for a higher second bandwidth of the baseband signal, the second control signal indicating a higher desired supply voltage than the first control signal; and supplying the second control signal to the power supply.

In example 27, the method of example 24, example 25 or example 26 further comprises calculating the bandwidth of the baseband signal.

In example 28, the radio frequency signal is a radio frequency signal for Long Term Evolution communications comprising a number of allocated resource blocks, and calculating the bandwidth of the baseband signal in the method of example 27 comprises calculating the bandwidth of the baseband signal based on the number of allocated resource blocks.

In example 29, generating the control signal in the method of any of the preceding examples further comprises generating the control signal based on a frequency of the radio frequency signal.

In example 30 the radio frequency signal is a radio frequency signal for Long Term Evolution communications comprising a plurality of allocated resource blocks at different frequencies of the radio frequency signal, and generating the control signal in the method of example 29 further comprises generating the control signal based on a frequency related to the different frequencies of the plurality of allocated resource blocks.

In example 31, the frequency related to the different frequencies of the plurality of allocated resource blocks is a center frequency of the different frequencies of the plurality of allocated resource blocks in the method of example 30.

In example 32, providing the control signal further in the method of any of the preceding examples comprises generate the control signal based on an average value of the supply voltage during a predefined time interval.

In example 33, generating the control signal based on the average value of the supply voltage in the method of example 32 comprises generating a control signal indicating a lower desired supply voltage than the instantaneous control signal, if the average value of the supply voltage is higher than a reference value for the supply voltage.

In example 34, the reference value for the supply voltage is different for different output power levels of the amplifier in the method of example 33.

In example 35, generating the control signal in the method of any of the preceding examples further comprises generating the control signal based on a device characteristic of the amplifier.

In example 36, the device characteristic of the amplifier in the method of example 35 comprises at least one of a gain dispersion of the amplifier and a load-line of the amplifier.

In example 37, the method of any of the preceding examples further comprises: generating a further control signal for a pre-distortion circuit based on the bandwidth of the baseband signal; and supplying, to the amplifier, a modified baseband signal based on the further control signal using the pre-distortion circuit.

Example 38 is a method for controlling a power supply supplying a variable supply voltage to an amplifier, the amplifier generating a radio frequency signal based on a baseband signal, wherein the method comprises mitigating a gain variation of the power supply by generating a control signal based on a bandwidth of the baseband signal and supplying the control signal to the power supply.

Example 39 is a computer readable storage medium having stored thereon a program having a program code for performing the method of any of examples 24 to 38, when the program is executed on a computer or processor.

Example 40 is a computer program having a program code configured to perform the method of any of examples 24 to 38, when the computer program is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A mobile communication device comprising:
an antenna element configured to transmit and receive radio frequency signals; and
a transmitter coupled to the antenna element, the transmitter having
an amplifier configured to provide an amplified radio frequency signal based on a baseband signal to the antenna element for transmission, and operating according to a supply voltage,
a power supply configured to generate the supply voltage based on a control signal, and
a control circuit configured to generate the control signal based on a bandwidth of the baseband signal in a manner that compensates for a bandwidth dependent output of the power supply.

2. The mobile communication device of claim 1, wherein the control circuit is configured to generate the control signal such that the control signal has:
a first value for a first bandwidth of the baseband signal, wherein the first value corresponds to a first voltage value of the supply voltage; and
a second value for a second bandwidth of the baseband signal higher than the first bandwidth, wherein the second value corresponds to a higher voltage value of the supply voltage than the first voltage value.

3. The mobile communication device of claim 1, wherein the control circuit comprises a signal analysis unit configured to calculate the bandwidth of the baseband signal.

4. The mobile communication device of claim 3, wherein the radio frequency signal is a radio frequency signal for Long Term Evolution communications comprising a number of allocated resource blocks, and wherein the signal analysis unit is configured to calculate the bandwidth of the baseband signal based on the number of allocated resource blocks.

5. The mobile communication device of claim 3, wherein the control circuit further comprises:
a gain unit configured to
generate an amplified signal by adjusting, according to a gain factor, an amplitude of a signal related to the baseband signal, and
adjust the gain factor based on the signal bandwidth of the baseband signal; and
a digital-to-analog conversion unit configured to generate the control signal for the power supply based on the amplified signal.

6. The mobile communication device of claim 5, wherein the signal related to the baseband signal includes information representative of a magnitude of the baseband signal.

7. The mobile communication device of claim 1, wherein the control circuit is configured to generate the control signal further based on a frequency of the radio frequency signal.

8. The mobile communication device of claim 7, wherein the radio frequency signal is a radio frequency signal for Long Term Evolution communications and comprises a plurality of allocated resource blocks at different frequencies of the radio frequency signal; and
wherein the control circuit is configured to generate the control signal further based on a frequency related to the different frequencies of the plurality of allocated resource blocks.

9. The mobile communication device of claim 8, wherein the frequency related to the different frequencies of the plurality of allocated resource blocks is a center frequency of the different frequencies of the plurality of allocated resource blocks.

10. The mobile communication device of claim 1, wherein the control circuit is configured to generate the control signal further based on an average value of the supply voltage during a predefined time interval.

11. The mobile communication device of claim 10, wherein the control circuit is configured to adjust the control signal to indicate a lower supply voltage than a current supply voltage if the average value of the supply voltage is higher than a reference value for the supply voltage.

12. The mobile communication device of claim 11, wherein the reference value for the supply voltage is different for different output power levels of the amplifier.

13. The mobile communication device of claim 1, wherein the control circuit is configured to:
generate an additional control signal based on the bandwidth of the baseband signal; and
supply, to the amplifier, a modified baseband signal based on the additional control signal.

14. The circuit of claim 1, wherein the control circuit is configured to generate the control signal further based on a power of the baseband signal.

15. A method for radio frequency signal generation, the method comprising:
amplifying, according to at least a variable amplifier-supply-voltage, a radio frequency signal generated based on a baseband signal; and
generating the variable amplifier-supply-voltage according to a control signal, wherein the control signal is based on a bandwidth of the baseband signal in a manner that compensates for a bandwidth dependency of the variable amplifier-supply-voltage.

16. The method of claim 15, further comprising
obtaining the radio frequency signal by predistorting an intermediate radio frequency signal generated based on the baseband signal; and
calculating the bandwidth of the baseband signal based on a number of resource blocks allocated for transmission of the amplified radio frequency signal.

17. The method of claim 15, wherein generating the control signal comprises generating the control signal further according to one or more of the following:
power of the baseband signal;
frequency of the radio frequency signal; and
power of the baseband signal and frequency of the radio frequency signal.

18. A transmitter circuit comprising:
a radio frequency signal generator configured to generate an intermediate radio frequency signal based on a baseband signal;
an amplifier configured to operate according to at least a supply voltage and amplify a radio frequency signal based on the intermediate radio frequency signal;
a power supply configured to generate the supply voltage according to at least a control signal; and
a control circuit configured to generate the control signal based on a bandwidth of the baseband signal in a manner that compensates for a bandwidth dependency of the supply voltage.

19. The transmitter circuit of claim 18, further comprising:
a predistortion circuit configured to predistort the intermediate radio frequency signal to generate the radio frequency signal.

20. The transmitter circuit of claim 18, further comprising a signal analysis circuit configured to determine the bandwidth of the baseband signal based on one or more of the following:
- a number of resource blocks allocated for transmission of the amplified radio frequency signal;
- a spectrum characteristic of the baseband signal;
- a contiguity of the spectrum characteristic;
- a number of spectral clusters of the baseband signal; and
- a distance between non-contiguous spectral clusters of the baseband signal.

\* \* \* \* \*